(12) United States Patent
Benzel et al.

(10) Patent No.: US 9,632,104 B2
(45) Date of Patent: Apr. 25, 2017

(54) SENSOR, METHOD FOR PRODUCING A SENSOR AND METHOD FOR MOUNTING A SENSOR

(71) Applicant: Robert Bosch GmbH, Stuttgart (DE)

(72) Inventors: Hubert Benzel, Pliezhausen (DE); Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 794 days.

(21) Appl. No.: 13/851,392

(22) Filed: Mar. 27, 2013

(65) Prior Publication Data

US 2013/0257420 A1 Oct. 3, 2013

(30) Foreign Application Priority Data

Mar. 27, 2012 (DE) ................. 10 2012 204 835

(51) Int. Cl.
*H01L 21/78* (2006.01)
*G01P 3/487* (2006.01)
*G01R 33/00* (2006.01)

(52) U.S. Cl.
CPC ............ *G01P 3/487* (2013.01); *H01L 21/78* (2013.01); *G01R 33/0052* (2013.01); *H01L 2224/48463* (2013.01); *H01L 2224/73265* (2013.01); *H01L 2924/10156* (2013.01); *Y10T 29/49128* (2015.01)

(58) Field of Classification Search
CPC ...... H01L 21/78; G01P 3/487; G01R 33/0052
See application file for complete search history.

(56) References Cited

U.S. PATENT DOCUMENTS

| 5,446,307 A | 8/1995 | Lux et al. |
| 2005/0174112 A1* | 8/2005 | Wakabayashi ......... G01D 5/145 324/251 |
| 2008/0197438 A1* | 8/2008 | Chan .................... H01L 21/78 257/434 |
| 2009/0027048 A1 | 1/2009 | Sato et al. |
| 2012/0199921 A1* | 8/2012 | Tanaka .................. G01L 1/148 257/415 |

FOREIGN PATENT DOCUMENTS

| CN | 101009262 A | 8/2007 |
| CN | 101325210 A | 12/2008 |
| DE | 10 2009 028 815 A1 | 2/2011 |

* cited by examiner

*Primary Examiner* — Whitney T Moore
*Assistant Examiner* — Joseph Galvin, III
(74) *Attorney, Agent, or Firm* — Maginot, Moore & Beck LLP (57) ABSTRACT

A sensor includes a body having a sensor surface and an oblique surface. A sensor element is arranged on the sensor surface and configured to pick up a direction component of a directional measurement variable. At least one contact-making surface configured to make contact with the sensor element is arranged on the oblique surface. The oblique surface is at an angle with respect to a lattice structure of carrier material of the sensor and is oriented in a different direction than the sensor surface.

8 Claims, 6 Drawing Sheets

SENSOR, METHOD FOR PRODUCING A SENSOR AND METHOD FOR MOUNTING A SENSOR

This application claims priority under 35 U.S.C. §119 to patent application no. DE 10 2012 204 835.9, filed on Mar. 27, 2012 in Germany, the disclosure of which is incorporated herein by reference in its entirety.

BACKGROUND

The present disclosure relates to a sensor, to a method for producing a first sensor and at least one second sensor, and to a method for mounting a sensor on a carrier structure.

Magnetic field sensors are nowadays combined with acceleration and rate-of-rotation sensors in a housing and used for navigation purposes. In this case, the magnetic field components in the x- and y-axes are measured by means of flux gate sensors, while the z-component is determined by means of a Hall IC.

DE 10 2009 028 815 A1 describes a magnetometer comprising a substrate and a magnetic core. The substrate has an excitation coil for generating a magnetic flux in the magnetic core, and the excitation coil has a coil cross section oriented substantially perpendicularly to a main extension plane of the substrate.

SUMMARY

Against this background, the present disclosure presents a sensor, a method for producing a first sensor and at least one second sensor, and a method for mounting a sensor on a carrier structure. Advantageous configurations are evident from the respective dependent claims and the following description.

In the case of a magnetic field sensor according to the flux gate/flip-core principle, e.g. a flux gate probe, a soft-magnetic core is driven alternately periodically to saturation. In this case, two coils are wound in opposite senses around the core. If a, for example sawtooth-shaped, alternating current flows in one (exciter) coil, it likewise induces a current, in a manner mediated via the common soft-magnetic coil core, upon the flipping-over of the magnetization in the other (receiving) coil. The excitation voltage and the reception voltage are equal in magnitude in the absence of an external field and cancel each other out by virtue of the winding in opposite senses. If an external magnetic field is then present, the vectorial component in the direction of the core generates a resulting signal in the receiver coil that is proportional to the applied field. Very small magnetic fields can be measured using this principle.

At an interface between a liquid and a gas, an interfacial tension is established which seeks to have the effect that the liquid has a surface area that is as small as possible. By way of example, a drop of water assumes as spherical a shape as possible, since the surface area of the water volume is thus the smallest.

If the liquid reaches a surface, then it has a characteristic contact angle at a drop boundary on the surface. The contact angle is dependent on a material pairing of the surface with respect to the liquid. If the surface has a good wettability relative to the liquid, the contact angle is less than 90°. If the surface has a poor wettability relative to the liquid, the contact angle is greater than 90°.

The disclosure is based on the insight that the interfacial tension of a liquid, for example fusible solder, can draw together two surfaces between which a drop of the liquid is arranged, if the liquid has a low contact angle and/or a high wettability at the surfaces. A force that occurs in this case can be large enough to rotate a component. The liquid can be a mounting material for mounting components on a carrier material. In particular, a component can be rotated by the liquid onto a beveled side, even though the component has been placed on a straight surface.

The present disclosure provides a sensor, wherein the sensor comprises the following features:
a sensor surface, on which a sensor element is arranged, said sensor element being designed to pick up a direction component of a directional measurement variable; and
an oblique surface, on which is arranged at least one contact-making surface for making contact with the sensor element, wherein the oblique surface is at an angle with respect to a lattice structure of carrier material of the sensor, and wherein the oblique surface is oriented in a different direction than the sensor surface.

Furthermore, the present disclosure provides a method for producing a first sensor and at least one second sensor, wherein the method comprises the following steps:
providing a wafer composed of crystalline carrier material, wherein a first sensor element and at least one second sensor element are arranged on a sensor surface of the wafer;
defining a processing surface on the sensor surface of the wafer, wherein the processing surface is arranged between the first sensor element and the second sensor element and separates the sensor elements to be produced from one another;
removing a part of the wafer in the region of the processing surface in order to produce a first oblique surface and a second oblique surface situated opposite, wherein removing is carried out using an anisotropic etching process in which the carrier material is removed at a specific angle with respect to a lattice structure of the carrier material in order to produce the oblique surfaces;
introducing at least one first contact-making surface for making contact with the first sensor element into the first oblique surface and at least one second contact-making surface for making contact with the second sensor element into the second oblique surface; and
separating the sensors between the first oblique surface and the second oblique surface in order to singulate the sensors.

Furthermore, the present disclosure provides a method for mounting a sensor on a carrier structure, wherein the sensor comprises a sensor surface, on which a sensor element is arranged, said sensor element being designed to pick up a direction component of a directional measurement variable, and the sensor comprises an oblique surface, on which is arranged at least one contact-making surface for making contact with the sensor element, wherein the oblique surface is at an angle with respect to a lattice structure of carrier material of the sensor, and wherein the oblique surface is oriented in a different direction than the sensor surface, wherein the method comprises the following steps:
positioning the sensor on the carrier structure, wherein the oblique surface of the sensor forms an acute angle with a surface of the carrier structure on a mounting surface, and wherein at least one partial region of the oblique surface and/or the mounting surface is covered with a mounting material;
liquefying mounting material arranged on the mounting surface in order to arrange the oblique surface on the mounting surface using an interfacial tension of the liquefied mounting material by tilting the sensor via an edge; and
hardening the mounting material in order to connect the sensor to the carrier structure.

A sensor can be understood to be a semiconductor component and/or a microelectromechanical structure. The sensor can be designed to map a measurable physical variable in an electrical signal. The measurable variable can have a spatial direction. The sensor can be designed to pick up a vectorial portion of the variable in a spatial direction. By way of example, the sensor can be designed to pick up a portion of a magnetic field. For this purpose, the sensor can comprise a sensor element, for example a magnetizable core, which is arranged in an influencing region of two oppositely directed coils. An effective direction of the coils can determine the direction of the vectorial portion. The sensor element can be introduced into a slab of carrier material, into a wafer, by means of microsystems engineering. A wafer can consist of a semiconductor material, for example. The wafer can consist of monocrystalline silicon, for example. Required worksteps can be effected from a top side and/or underside of the wafer. A sensor surface can be understood to be a surface of the wafer on and/or in which the sensor element is arranged. An oblique surface can be at a predetermined angle with respect to a crystal structure of the carrier material. A course or an orientation of the oblique surface can be arranged in or correspond to a crystal plane of the carrier material. The oblique surface can be at a predetermined angle with respect to the sensor surface, wherein the oblique surface is expediently oriented in an inclined fashion relative to the sensor surface. A contact-making surface can be an electrically conductive structure. By way of example, the contact-making surface can be a metallic surface on the carrier material on which contact can be made with the sensor element. By way of example, contact-making can be effected by means of a bonding wire or else by means of a soldering pad on a carrier structure. A processing surface can be defined, for example, by means of a mask composed of e.g. silicon nitride. Removing can be effected by means of a solvent or etchant that anisotropically attacks the carrier material. By way of example, the etchant can be potassium hydroxide KOH. The solvent or etchant can remove the carrier material as far as a defined crystal plane which is at the determined angle with respect to the crystal structure of the wafer. In order to introduce a contact-making surface into the oblique surface, the oblique surface can be masked again. The oblique surface can have an insulating layer below the contact-making surface. The insulating layer can be applied prior to masking. In order to separate the sensors, the wafer can be sawn. The wafer can also be separated by means of laser beam cutting. A mounting space (also designated as mounting surface) can be a space provided for the sensor or a surface provided therefor on the carrier structure. The carrier structure can be, for example, a wall of a housing or a printed circuit board. The mounting space can be, for example, a solder pad or an adhesive pad. By way of example, the solder can be applied as solder paste and become fusible under the action of heat. The insulating layer can be repellent to the solder. The contact-making surface can be readily wettable by the solder. An interfacial tension can be a surface tension which can occur between two immiscible media and represents an urge of the media to form a common surface area that is as small as possible. The liquefied mounting material can exert a tensile force on the contact-making surface and rotate the sensor. When the mounting material cools, the sensor in a rotated position can be connected to the carrier structure.

The sensor can also comprise a main body having a first fixing surface for fixing the sensor to a carrier structure in a first spatial direction and at least one second fixing surface for fixing the sensor to the carrier structure in a second spatial direction, wherein the first fixing surface is oriented at an angle with respect to the second fixing surface, wherein the first fixing surface and the second fixing surface have a common edge. The sensor can comprise a sensor element arranged on the first fixing surface or on a surface of the sensor that is arranged opposite the first fixing surface, wherein the sensor is designed to pick up a direction component of a directional measurement variable. The sensor can comprise at least one first contact-making surface which is arranged on the surface or the first fixing surface and is connected to the sensor element. The sensor can comprise at least one second contact-making surface which is arranged on the second fixing surface or a bevel of the sensor that is arranged opposite the second fixing surface, and is electrically conductively connected to the first contact-making surface. The second contact-making surface can be larger than the first contact-making surface.

The sensor surface and the oblique surface can have a common edge. The sensor can be tilted via the common edge during mounting. The common edge can be positioned within the mounting space.

At least one further contact-making surface can be arranged on the sensor surface, wherein the further contact-making surface has smaller dimensions than the contact-making surface on the oblique side. The liquefied mounting material can exert a larger force on the larger surface; the sensor can thus be tilted when the mounting material is liquefied.

The processing surface can be defined using a relationship between a desired processing depth and the determined angle. In particular, the processing depth can have a magnitude approximately half that of the width of the processing surface.

The wafer can thus be almost completely severed, as a result of which a smaller layer thickness has to be severed in the separating step.

In the step of defining, a second processing surface can be defined on an underside of the wafer situated opposite the sensor surface. In the step of removing, carrier material can be removed in the region of the second processing surface using the anisotropic etching process, in order to produce further oblique surfaces. Further oblique surfaces can be introduced rearward into the wafer. By virtue of the further oblique surfaces, the sensors can be produced symmetrically.

The second processing surface on the underside can be defined with a predetermined lateral offset with respect to the processing surface on the sensor surface. The sensor can thus have a parallelogram-like cross section. A center of gravity of the sensor can then be near to a tilting edge.

The carrier material can be repellent to the mounting material. In the step of liquefying, the liquefied mounting material can be repelled by the carrier material. The mounting material can adhere to the contact-making surface. As a result of adhesion to the contact-making surfaces rather than to the carrier material, it is possible to achieve an insulation of the individual contact-making surfaces from one another. Short circuits can thus be prevented.

The sensor can be positioned in the manner offset to at least two mounting surfaces, wherein the mounting surfaces are embodied as contact surfaces of the carrier structure for making electrical contact with the sensor, and, in the step of hardening, contact-making surfaces of the sensor that are arranged on the oblique surface are electrically conductively connected to the contact surfaces of the carrier structure. It is thus possible to produce a plurality of electrical connections to the sensor. By way of example, at least four electrical contacts can be created for a magnetic field sensor.

BRIEF DESCRIPTION OF THE DRAWINGS

The disclosure is explained in greater detail by way of example below with reference to the accompanying drawings, in which.

DETAILED DESCRIPTION

In the following description of preferred exemplary embodiments of the present disclosure, identical or similar reference signs are used for the similarly acting elements illustrated in the different figures, a repeated description of these elements being dispensed with.

Figure 1:
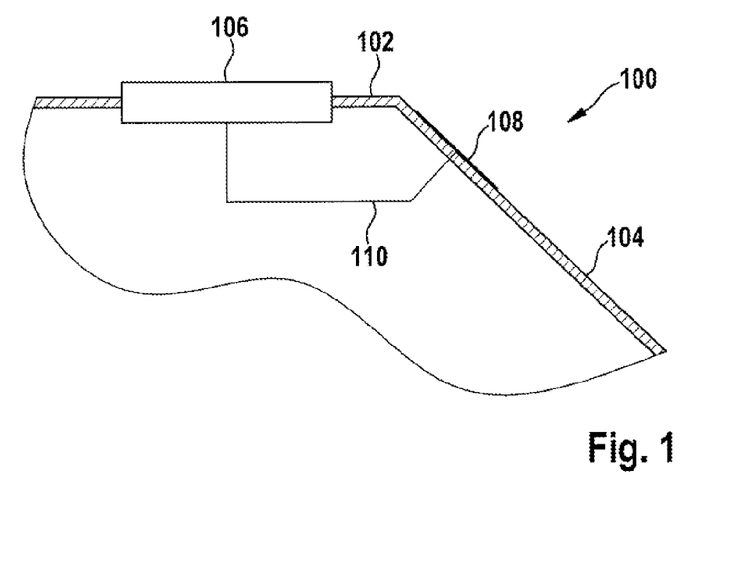
FIG. 1 shows an excerpt from a sensor in accordance with one exemplary embodiment of the present disclosure.

FIG. 1 shows an excerpt from a sensor 100 in accordance with one exemplary embodiment of the present disclosure. The sensor 100 comprises a sensor surface 102 and an oblique surface 104. The oblique surface 104 is at an angle with respect to a lattice structure of carrier material of the sensor 100. By way of example, the angle corresponds to the crystal angle between a "111 plane" and an "001 plane". A sensor element 106 is arranged on the sensor surface 102, said sensor element being designed to pick up a direction component of a directional measurement variable. By way of example, the sensor element 106 is a magnetic field sensor designed to pick up a magnetic field component of a surrounding magnetic field, said magnetic field component corresponding to the measurement direction of said sensor. At least one contact-making surface 108 for making contact with the sensor element 106 is arranged on the oblique surface 104. The contact-making surface 108 is connected to the sensor element 106 via an electrical conductor track 110. If a plurality of contact-making surfaces 108 are present on the oblique surface 104, then the sensor element 106 is connected to the contact-making surfaces 108 via a plurality of conductor tracks 110.

In other words, FIG. 1 shows a component 100 which is characterized in that all contact surfaces 108 are provided on one and the same side edge 104 arranged obliquely with respect to a first surface 102. An electrical circuit or an MEMS element 106 is integrated on the first surface 102. The MEMS element 106 can be a magnetometer. The contact surfaces 108 are arranged on the edge having the largest extent. The contact surfaces 108 have a smaller extent on the first surface 102 than on the side 104 arranged obliquely with respect thereto. The component can be arranged in a tilted manner on a housing base (e.g. a printed circuit board) by means of the contact surfaces 108, wherein the tombstone effect, in particular, is used for tilting.

Figure 2:
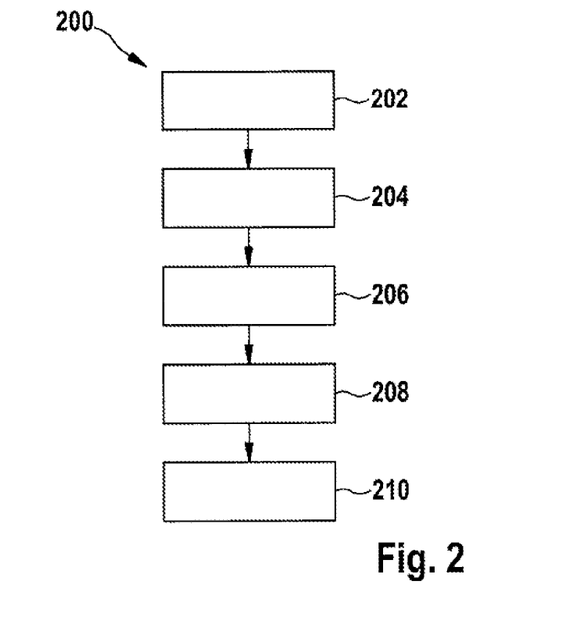
FIG. 2 shows a flowchart of a method for producing a sensor in accordance with one exemplary embodiment of the present disclosure.

FIG. 2 shows a flowchart of a method 200 for producing a sensor in accordance with one exemplary embodiment of the present disclosure. The method 200 involves producing at least one first sensor and at least one second sensor such as are described in FIG. 1. The method 200 comprises a step of providing 202, a step of defining 204, a step of removing 206, a step of introducing 208 and a step of separating 210. In the step of providing 202, a wafer composed of crystalline carrier material is provided. A first sensor element and at least one second sensor element are arranged on a sensor surface of the wafer. The sensor elements have been introduced into the sensor surface of the wafer in preceding processing steps. In the step of defining 204, a processing surface is defined on the sensor surface of the wafer. The processing surface is arranged between the first sensor element and the second sensor element. The processing surface separates the sensor elements to be produced from one another. In the processing surface, the carrier material of the wafer is exposed. Outside the processing surface, the wafer including the sensor elements are covered with an etching mask and thus protected. In the step of removing 206, a part of the wafer is removed in the region of the processing surface in order to produce a first oblique surface and a second oblique surface situated opposite. In this case, the first and second oblique surfaces can form different angles with the surface of the carrier material. The first oblique surface is arranged in the region of the first sensor, and the second oblique surface is arranged in the region of the second sensor. Removing is carried out using an anisotropic etching process. During the anisotropic etching process, the carrier material is removed at a determined angle with respect to a lattice structure of the carrier material in order to produce the oblique surfaces. In the step of introducing 208, at least one first contact-making surface for making contact with the first sensor element is introduced into the first oblique surface. A second contact-making surface for making contact with the second sensor element can advantageously be introduced simultaneously into the second oblique surface. Introducing can be carried out using known production processes, such as trenching, vapor deposition, electroplating, passivation, etc. The contact-making surfaces are each electrically connected to one of the sensor elements. In the step of separating 210, the sensors are separated between the first oblique surface and the second oblique surface in order to singulate the sensors. Separating can be carried out using known processes such as sawing, etching, laser cutting, etc.

Figure 3:
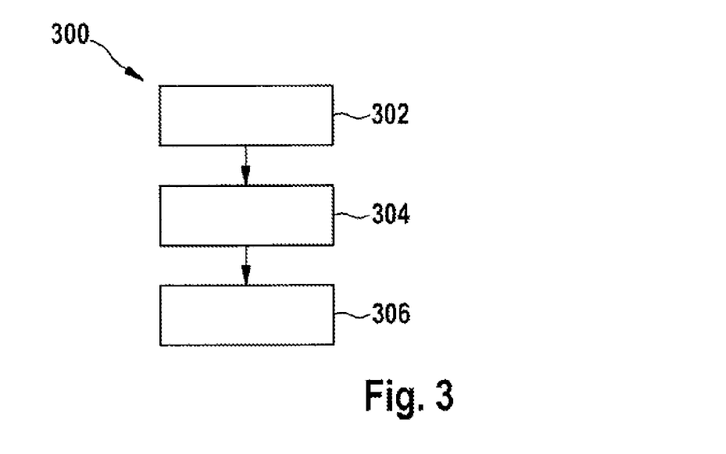
FIG. 3 shows a flowchart of a method for mounting a sensor in accordance with one exemplary embodiment of the present disclosure.

FIG. 3 shows a flowchart of a method 300 for mounting a sensor in accordance with one exemplary embodiment of the present disclosure. In this case, the sensor corresponds to a sensor such as is described in FIG. 1, and can be produced in accordance with a production method such as is described in FIG. 2. The sensor comprises a sensor surface, on which a sensor element is arranged, said sensor element being designed to pick up a direction component of a directional measurement variable. The sensor furthermore comprises an oblique surface, on which is arranged at least one contact-making surface for making contact with the sensor element. The oblique surface is at an angle with respect to a lattice structure of carrier material of the sensor, wherein the oblique surface is oriented in a different direction than the sensor surface. The sensor can be fed to an automatic placement machine as a singulated component on a tape, for example. The method 300 comprises a step of positioning 302, a step of liquefying 304 and a step of hardening 306. In the step of positioning 302, the sensor is positioned on the carrier structure, wherein the oblique surface of the sensor forms an acute angle with a surface of the carrier structure on a mounting surface, and wherein at least one partial region of the oblique surface and/or of the mounting surface is covered with a mounting material. The sensor surface of the sensor is therefore oriented approximately parallel to a surface of the carrier structure after positioning. In the step of liquefying 304, mounting material arranged on the mounting surface is liquefied. By way of example, the mounting material is heated until it melts. The oblique surface is drawn to the mounting surface using an interfacial tension of the liquefied mounting material. In this case, the sensor is tilted via an edge. In the step of hardening 306, the mounting material is solidified in order to connect the sensor to the carrier structure. By way of example, the mounting material is cooled.

In other words, FIG. 3 shows a method 300 for the targeted tilting of a component by a defined angle or for making contact with a sensor chip at an oblique chip edge. In this case, the sensor element is rotated by approximately 55°, such that the sensitive layers become situated laterally obliquely. Thus, the xz- and yz-components of a magnetic field can be measured by means of only two flux gates without a Hall element.

FIGS. 4a to 4d show illustrations of arrangements of components after performing process steps for producing a sensor 100 in accordance with one exemplary embodiment of the present disclosure. The figures show steps for producing four sensors 100a to 100d each comprising a sensor element 106.

Figure 4A:
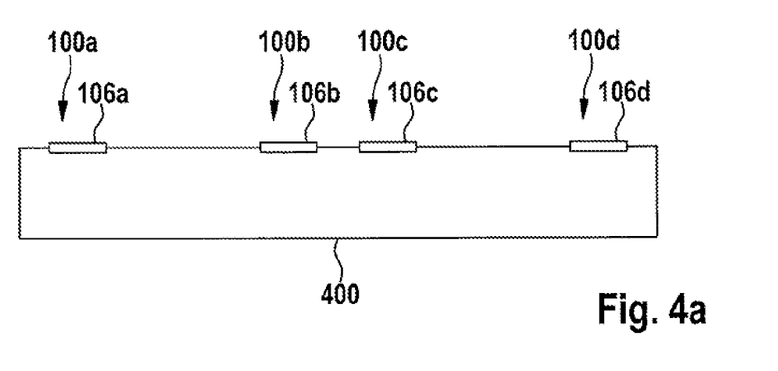
FIGS. 4a to 4d show illustrations of arrangements of components after performing process steps for producing a sensor in accordance with one exemplary embodiment of the present disclosure.

FIG. 4a illustrates a wafer 400, on one surface of which, in a manner representative of a multiplicity of sensor elements 106, which can also be distributed areally on the wafer 400, four sensor elements 106a, 106b, 106c and 106d are arranged in a row. The sensor elements 106 have a large distance between the sensor element 106a and the sensor element 106b. There is a small distance between the sensor element 106b and the sensor element 106c. Between the sensor element 106c and the sensor element 106d there is once again the large distance as between the sensor elements 106a and 106b. No sensor element is arranged on an underside of the wafer 400. The wafer 400 consists of a crystalline carrier material, for example monocrystalline silicon. The large distance corresponds, for example, to a thickness of the wafer 400.

Figure 4B:
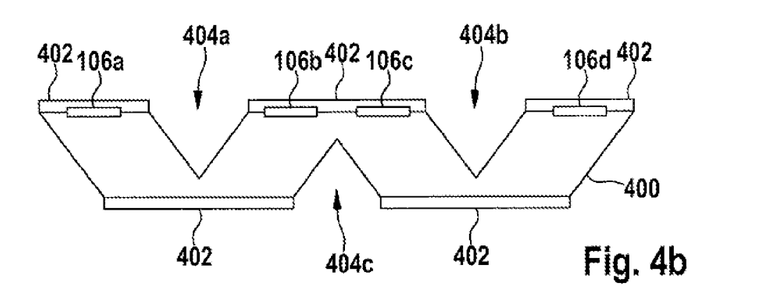

FIG. 4b illustrates the wafer 400 after the preceding step of removing, as described in FIG. 2. Prior to removing, the wafer 400 was masked. An etching mask composed of silicon nitride 402, for example, covers the sensor elements 106. In this case, the etching mask 402 leaves free a processing surface 404a between the sensor element 106a and the sensor element 106b. The sensor element 406b and 406c are jointly covered by the etching mask 402 without an intervening processing surface. A processing surface 404b is once again arranged between the sensor element 406c and the sensor element 406d. The processing surfaces 404 are equal in size. An etching mask 402 has likewise been applied on the underside of the wafer 400. The lower etching mask 402 leaves out a further processing surface 404c arranged centrally between the sensor element 106b and the sensor element 406c. The surfaces of the etching mask 402 on the underside can correspond to the surfaces on the top side. A respective processing surface is likewise arranged below the sensor elements 106a and 106b. In the region of the processing surfaces 404, carrier material has been etched out from the wafer 400. Since an anisotropic etching process has been used, side flanks in the region of the processing surfaces 404 are at a predetermined angle with respect to the crystal structure of the carrier material. Oblique surfaces arise as a result of the etching. The etches have penetrated into the wafer 400 until the oblique surfaces directly meet. As a result, the wafer 400 has an angular, undulatory profile.

Figure 4C:
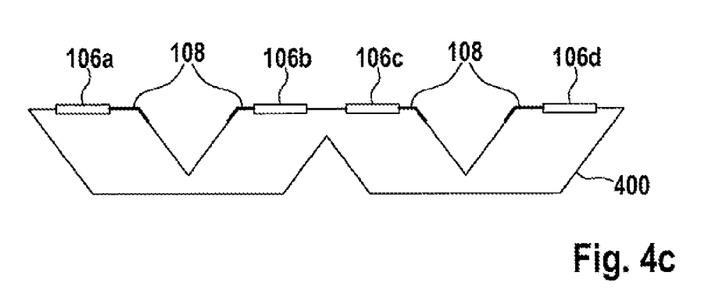

In FIG. 4c, the etching mask has been removed. In an introducing step, described in FIG. 2, contact-making surfaces 108 have been introduced into and/or onto the sensor surface of the wafer 400 and into and/or onto the oblique surfaces. In this case, the contact-making surfaces 108 each run from a sensor 106 on the sensor surface as far as an edge with the oblique surface and further on the oblique surface.

Figure 4D:
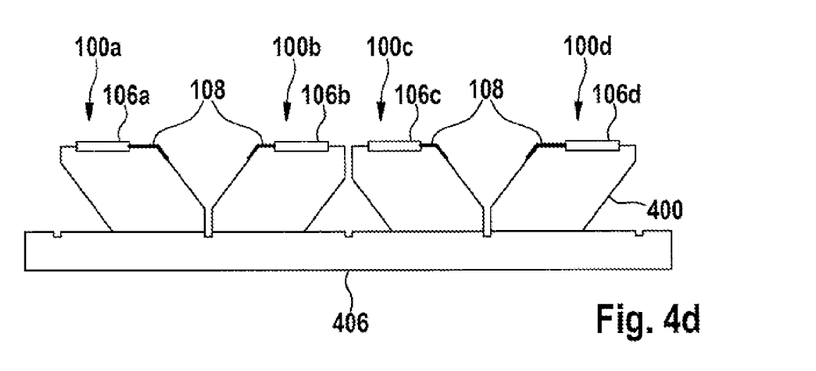

FIG. 4d illustrates the sensors 100a to 100d after separating. For this purpose, the wafer 400 has been adhesively bonded by the underside on a tape 406. In this exemplary embodiment, the sensors 100a to 100d have been sawn for separating purposes. Sawing cuts for this purpose are at a uniform distance and extend right into the tape 406. The sawing cuts are arranged between the oblique surfaces on both sides of the wafer 400 and run in the direction of the resulting etching notches centrally along a course of the processing surfaces from FIG. 4b. The sensors now have a basic shape of a parallelogram with broken edges. The broken edges are in this case the sawing edges produced during separating. The sensors 100b and 100d are oriented in a mirror-inverted fashion with respect to the sensors 100a and 100c.

In other words, FIGS. 4a to 4d show arrangements of components after performing steps of a production method in which V-shaped pits are introduced into a substrate. An insulation layer is subsequently introduced into the pits. Afterward, electrical lines are applied, which run partly both on the first surface, the sensor surface, and in the region of the pit walls, the oblique surface.

The production process can begin by applying the magnetic field sensors 106 (flux gates, FG). In this case, it is possible firstly to apply an insulation layer (e.g. an oxide) for the flux gates. Afterward, it is possible to apply a lower metal plane of the flux gates. Afterward, it is possible to apply a further insulation layer (e.g. the oxide) for the flux gates. It is thereupon possible to apply a magnetic core of the flux gate. Optionally, it is thereupon possible to apply an additional insulation layer (e.g. the oxide) for the flux gates.

Prior to etching, a mask 402 for the KOH etching (e.g. SiN) is applied and patterned. Afterward, as illustrated in FIG. 4b, the KOH etching can be effected on the front side. Optionally, etching can simultaneously be effected on the rear side. In this case, the etching depth is chosen to be less than the wafer thickness.

After etching, the KOH etching mask 402 can be removed. Subsequently, an insulation oxide is deposited (e.g. by means of PECVD) on the carrier material 400. Contact holes for a second metal plane (flux gates+contact pads) are opened in order to enable contact-making. The second metal plane is thereupon applied and patterned by means of a spray coating process, for example. Optionally, a passivation layer, e.g. a nitride layer, is applied. The contact pads 108 are opened by means of a further spray coating process and further etching of the passivation (see FIG. 4c).

The sensors 100 are singulated by sawing or laser beam cutting, which can also be effected with an active structure toward the tape 406 (see FIG. 4d).

Figure 5A:
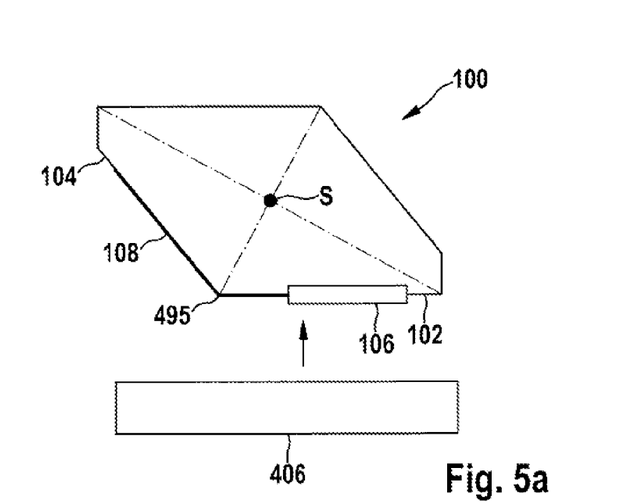
FIGS. 5a to 5c show illustrations of arrangements of components after performing steps of mounting a sensor in accordance with one exemplary embodiment of the present disclosure.
Figure 5B:
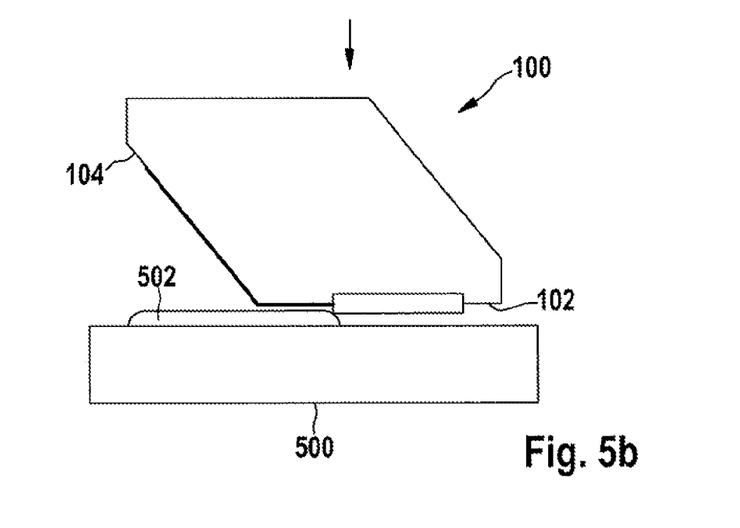
Figure 5C:
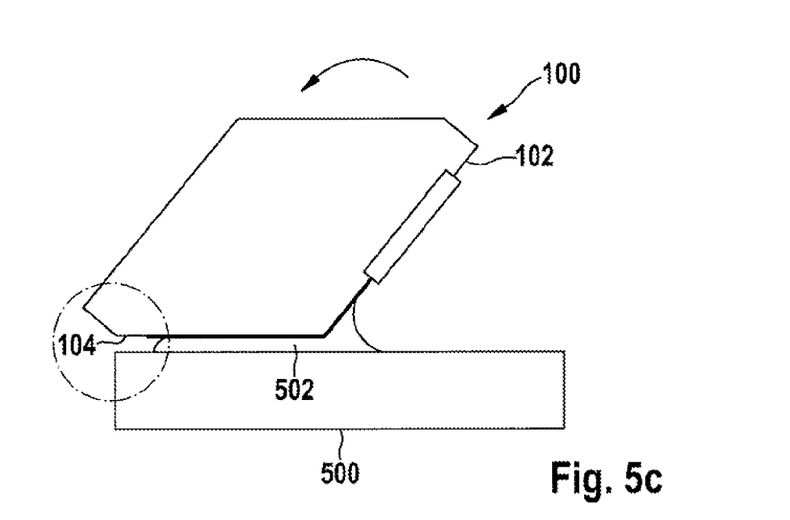

FIGS. 5a to 5c show illustrations of arrangements of components after performing steps of mounting a sensor 100 in accordance with one exemplary embodiment of the present disclosure. The sensor 100 comprises a basic body having a cross-sectional area in the form of a parallelogram. Two mutually opposite acute vertices of the parallelogram have a facet. The sensor 100 comprises a sensor element 106 on a sensor surface 102. In this exemplary embodiment, the sensor element 106 is a flip-core element. The sensor 100 furthermore comprises contact surfaces 108 on an oblique surface 104. The contact surfaces 108 are connected to the sensor element 106 and have continuations on the sensor surface 102. The main body is symmetrical and has a center of gravity S situated centrally. The center of gravity S is situated on an intersection of a short axis and long axis of the parallelogram. The sensor surface 102 and the oblique surface 104 have a common bending line. In this exemplary embodiment, the sensor surface 102 is oriented downward, and the oblique surface 104 is at an angle of approximately 55° with respect to the sensor surface 102 at the bending line.

FIG. 5a depicts the sensor 100 directly after the sensor 100 has been picked up from a tape 406. The sensor 100 had been arranged with the sensor surface 102 on the tape 406. The sensor surface 102 is oriented parallel to the tape 406.

FIG. 5b illustrates the sensor 100 such as has been positioned on a printed circuit board 500 as carrier structure. The sensor 100 is oriented with the sensor surface 102 toward the printed circuit board 500. The oblique surface 104 is arranged above a soldering pad 502 as mounting surface on the printed circuit board 500.

Soldering paste is applied as mounting means on the soldering pad 502. The soldering paste extends a little way actually onto the sensor surface 102 in order to hold the sensor 100 by adhesion after positioning, such that the sensor 100 cannot slip. For this purpose, the bending line is pressed into the soldering paste.

FIG. 5c illustrates the sensor 100 after the mounting means has been liquefied on the soldering pad 502. The liquefied solder wets the contact surfaces 108 well, for which reason the solder migrates up the oblique surface 104 at the obliquely oriented contact surfaces 108 by way of the capillary effect. In this case, the solder, by means of its interfacial tension, exerts a tensile force on the oblique surface 104. If the tensile force is high enough, the sensor 100 is tilted via the bending line and thus lies on the oblique surface. The sensor surface 102 is now oriented obliquely with respect to the printed circuit board 500.

In other words, FIGS. 5a to 5c show arrangements of components after performing steps of a mounting method in which a component 100 with a beveled surface 104 is applied on a substrate 500 asymmetrically with respect to a solder surface 502, such that there is only a comparatively small overlap between the contact surface on the first surface 102 and the solder pad 502. In this case, the production and mounting method is self-aligning since the tilting angle sets itself as a result of the anisotropic KOH etching process, or the tilting onto the oblique surface 104 is effected by means of the tombstone effect.

The sensor element 100 with the front side facing downward is picked up from the tape 406 (see FIG. 5a) and positioned on the solder paste already dispensed on the housing base 500 (see FIG. 5b). The center of gravity S of the component 100 is advantageously situated very closely above the bending line 495, which facilitates the tombstone effect and thus the tilting via the bending line 495. During reflow soldering, the solder paste melts and the surface tension of the solder in this case exerts a torque on the component 100 since it is fixed only at an edge 495). The sensor element 100 therefore tilts onto the oblique side 104 (see FIG. 5c). Thus, the xz- and yz-components of the magnetic field can now be measured. One particular advantage of the mounting method presented here is that the process proceeds in a self-aligning manner.

A risk of short circuits can be avoided by means of short conductor tracks 502 on which the solder is applied on the carrier substrate 500, and a bonding pad region 108 that is longer than the conductor tracks. As a result, the sensor element 100 is centered and the meniscus that forms draws the solder away from the chip surface. The KOH flank 104 is insulated by an oxide or nitride layer below the metallization, such that no solder can adhere to the Si surface. As a result, no solder can pass to the sawing surface.

Figure 6A:
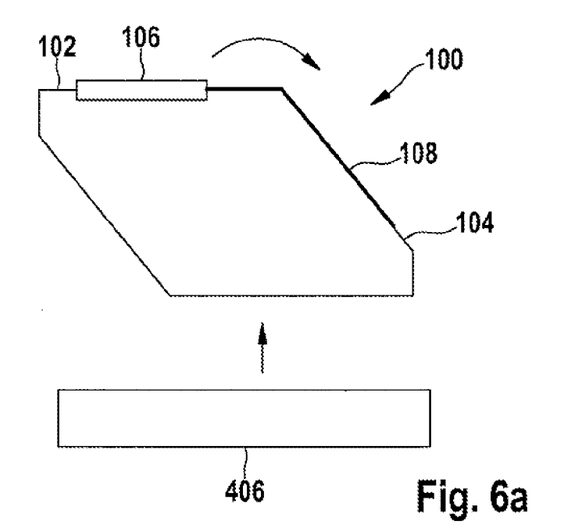
FIGS. 6a and 6b show illustrations of arrangements of components after performing alternative steps of mounting a sensor in accordance with one exemplary embodiment of the present disclosure.
Figure 6B:
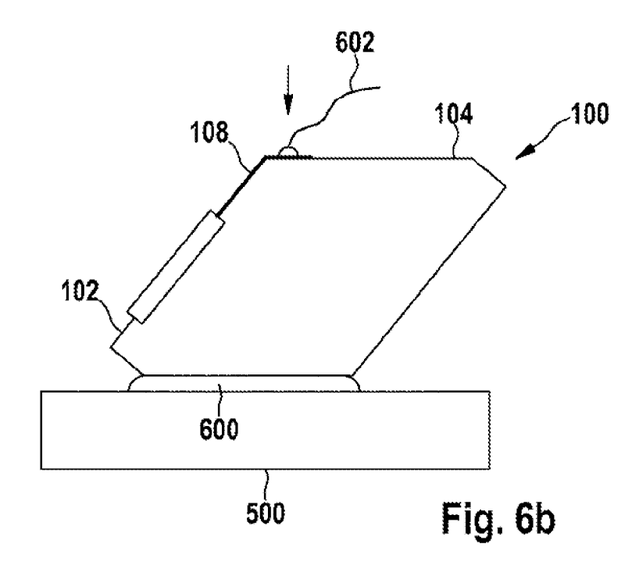

FIGS. 6a and 6b show illustrations of alternative steps of mounting a sensor 100 in accordance with one exemplary embodiment of the present disclosure. The sensor 100 corresponds to the sensor such as can be produced on the basis of the mounting method described with reference to FIG. 5.

FIG. 5a shows, as in FIG. 6a, how the sensor 100 has been lifted off from a tape 406. In contrast to FIG. 5, the sensor surface 102 with the sensor element 106 is oriented away from the tape 406. The oblique surface 104 with the contact-making surfaces 108 is likewise oriented away from the tape 406.

FIG. 6b illustrates the sensor 100 fixed on a slab 500, as in FIG. 5c. In contrast to the fixing in FIG. 5c, the sensor 100 has been rotated in the air, prior to placement, by approximately 55°, such that a parallel surface situated opposite the oblique surface 104 is oriented toward the slab 500. The sensor surface 102 is thereby oriented obliquely. Subsequently, the sensor 100 has been placed onto an adhesive pad 600. The oblique surface 104 with the contact-making surfaces 108 now faces upward. For illustration purposes, a bonding wire 602 is depicted as bonded on one of the contact-making surfaces 108.

In other words, in FIGS. 6a and 6b, the sensor element 100 is picked up from the tape 406, subsequently inclined by approximately 55° and positioned on the adhesive already dispensed on the housing base 500. The sensor element 100 is then situated obliquely, as a result of which the xz- and yz-components of the magnetic field can be measured. The bonding pads 108, however, lie on the top side—running parallel to the housing base—of the chip 100 (KOH flank 104). One particular advantage is that the pads 108 lie approximately above the center of the adhesive surface 600, such that the wire bonding functions particularly well (no tensile forces in the adhesive).

The exemplary embodiments described and shown in the figures have been chosen merely by way of example. Different exemplary embodiments can be combined with one another completely or with regard to individual features. Moreover, one exemplary embodiment can be supplemented by features of a further exemplary embodiment.

Furthermore, method steps according to the disclosure can be performed repeatedly and in a different order than in the order described.

If an exemplary embodiment includes an "and/or" link between a first feature and a second feature, then this should be taken to mean that the exemplary embodiment comprises both the first feature and the second feature in accordance with one embodiment and either only the first feature or only the second feature in accordance with a further embodiment.

What is claimed is:

1. A method for producing a first sensor and at least one second sensor, comprising:
   arranging a first sensor element that detects a physical property and at least one second sensor element that detects the physical property on a sensor surface of a wafer, the wafer comprising a crystalline carrier material;
   defining a processing surface on the sensor surface of the wafer, the processing surface being arranged between the first sensor element and the second sensor element and configured to separate the sensor elements to be produced from one another;
   removing a portion of the wafer in the region of the processing surface so as to produce a first oblique surface and a second oblique surface situated opposite the first oblique surface, the removing of the portion being carried out using an anisotropic etching process in which the carrier material is removed at a predetermined angle with respect to a lattice structure of the carrier material so as to produce the oblique surfaces;
   introducing at least one first contact-making surface onto the first oblique surface, the at least one first contact-making surface being configured to make contact with the first sensor element; and
   separating the sensors between the first oblique surface and the second oblique surface so as to singulate the sensors.

2. The method according to claim 1, further comprising introducing at least one second contact-making surface onto the second oblique surface, the at least one second contact-making surface being configured to make contact with the second sensor element.

3. The method according to claim 1, wherein the processing surface is defined using a relationship between a desired processing depth and the predetermined angle.

4. The method according to claim 1, further comprising defining a second processing surface on an underside of the wafer situated opposite the sensor surface, wherein carrier material is removed in the region of the second processing surface using the using the anisotropic etching process so as to produce further oblique surfaces.

5. The method according to claim 4, wherein the second processing surface is defined with a predetermined lateral offset with respect to the processing surface on the sensor surface.

6. A method for mounting a sensor on a carrier structure, the sensor including a body having a sensor surface and an oblique surface, a sensor element arranged on the sensor surface and configured to pick up a direction component of a directional measurement variable, and at least one contact-making surface arranged on the oblique surface and configured to make contact with the sensor element, wherein the oblique surface is at an angle with respect to a lattice structure of carrier material of the sensor, and wherein the oblique surface is oriented in a different direction than the sensor surface, the method comprising:
   positioning the sensor on the carrier structure such that (i) the oblique surface of the sensor forms an acute angle with a surface of the carrier structure on a mounting surface and (ii) at least one partial region of one or more of the oblique surface and the mounting surface is covered with a mounting material;
   liquefying mounting material arranged on the mounting surface so as to arrange the oblique surface on the mounting surface using an interfacial tension of the liquefied mounting material by tilting the sensor via an edge; and
   hardening the mounting material so as to connect the sensor to the carrier structure.

7. The method according to claim 6, wherein the carrier material is configured to repel the mounting material and, when the mounting material is liquefied, the mounting material is repelled by the carrier material and adheres to the contact-making surface.

8. The method according to claim 6, wherein the sensor is positioned in a manner offset with respect to at least two mounting surfaces, wherein the mounting surfaces are embodied as contact surfaces of the carrier structure configured to make electrical contact with the sensor, and wherein the contact-making surfaces of the sensor arranged on the oblique surface are electrically conductively connected to the contact surfaces of the carrier structure when the mounting material is hardened.

* * * * *